(12) United States Patent
Thomas

(10) Patent No.: US 11,122,691 B2
(45) Date of Patent: Sep. 14, 2021

(54) SYSTEMS FOR APPLYING ELECTRICALLY CONDUCTIVE TAPE TRACES TO A SUBSTRATE AND METHODS OF USE THEREOF

(71) Applicant: Ford Motor Company, Dearborn, MI (US)

(72) Inventor: Galen Keith Thomas, Dearborn, MI (US)

(73) Assignee: Ford Motor Company, Dearborn, MI (US)

( * ) Notice: Subject to any disclaimer, the term of this patent is extended or adjusted under 35 U.S.C. 154(b) by 0 days.

(21) Appl. No.: 16/289,984

(22) Filed: Mar. 1, 2019

(65) Prior Publication Data

US 2020/0281079 A1 Sep. 3, 2020

(51) Int. Cl.
*H05K 3/12* (2006.01)
*H05K 3/32* (2006.01)
*H05K 1/05* (2006.01)

(52) U.S. Cl.
CPC .............. *H05K 3/1275* (2013.01); *H05K 1/05* (2013.01); *H05K 3/321* (2013.01)

(58) Field of Classification Search
CPC ...... H05K 3/321; H05K 3/323; H05K 3/1275; H05K 1/05; H05K 3/10; B29C 70/388; B29C 65/5092; B65C 9/12–1896; B65H 35/0013; B65H 37/002; Y10T 156/1788; Y10T 156/1793; Y10T 156/1795; Y10T 156/171; Y10T 156/1089; Y10T 156/1092; Y10T 156/1705; Y10T 156/1707

USPC ................................ 156/542, 574, 576, 577
See application file for complete search history.

(56) References Cited

U.S. PATENT DOCUMENTS

| | | |
|---|---|---|
| 4,848,829 A | 7/1989 | Kidd |
| 5,575,554 A | 11/1996 | Guritz |
| 5,712,764 A | 1/1998 | Baker et al. |
| 9,782,686 B2 | 10/2017 | Hellenga |
| 2008/0197700 A1 | 8/2008 | Hartmann et al. |

(Continued)

FOREIGN PATENT DOCUMENTS

| | | | |
|---|---|---|---|
| JP | H04357896 | 12/1992 | |
| JP | 2015067283 A | * 4/2015 | ........... B65C 9/1865 |

OTHER PUBLICATIONS

Machine translation of JP 2015-67283 date unknown.*

*Primary Examiner* — John L Goff, II
(74) *Attorney, Agent, or Firm* — Burris Law, PLLC

(57) ABSTRACT

A system for forming a conductive tape trace on a substrate includes a segment feeder arm configured to feed segments of conductive tape to the substrate and a segment placement armature configured to grasp and position the conductive tape segments in a predetermined pattern on the substrate. The conductive tape segments include a plurality of conductive tape bend segments and at least one conductive tape branch segment. The segment placement armature is configured to position and overlap the plurality of conductive tape bend segments on the substrate to form a conductive tape bend and position the at least one conductive tape branch segment in contact with and extending from the conductive tape bend. A roller can be included and be configured to apply a force onto the conductive tape segments positioned on the substrate. A welder that welds the conductive tape segments together can also be included.

15 Claims, 7 Drawing Sheets

(56) References Cited

U.S. PATENT DOCUMENTS

Figure 1:
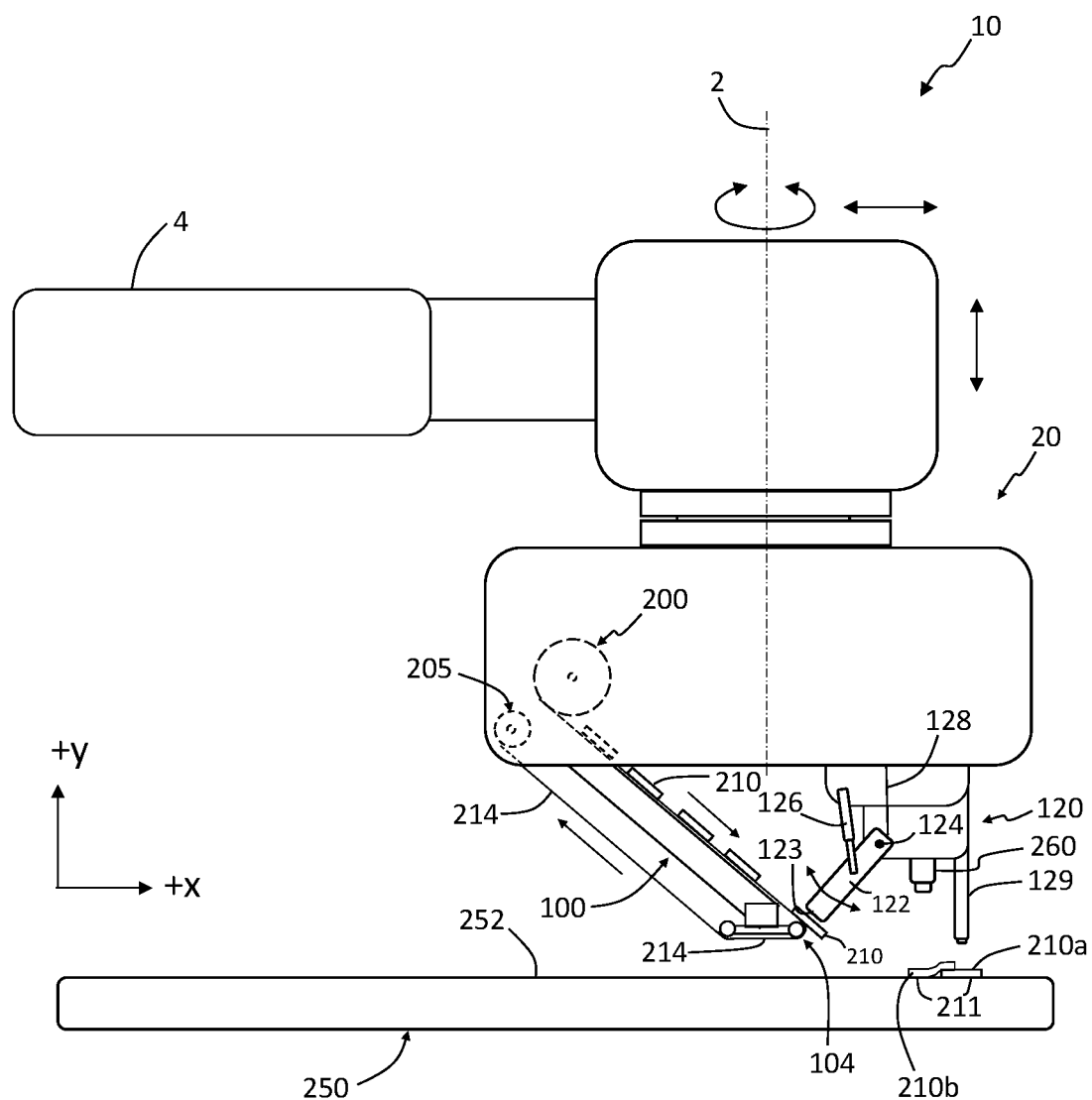

| | | | |
|---|---|---|---|
| 2009/0263618 A1* | 10/2009 | McCarville | B29C 70/30 428/113 |
| 2011/0048609 A1* | 3/2011 | Miyamoto | B65H 35/0013 156/64 |
| 2012/0048448 A1* | 3/2012 | Malik, Jr. | B65H 37/002 156/64 |
| 2012/0325398 A1* | 12/2012 | Silcock | B29C 66/9241 156/176 |
| 2013/0340918 A1* | 12/2013 | Dods | B65C 9/1865 156/73.6 |
| 2015/0036307 A1 | 2/2015 | Stone | |

* cited by examiner

SYSTEMS FOR APPLYING ELECTRICALLY CONDUCTIVE TAPE TRACES TO A SUBSTRATE AND METHODS OF USE THEREOF

FIELD

The present disclosure relates to electrically conductive traces, and more particularly to systems and methods for applying electrically conductive tape to substrate to form an electrically conductive traces on the substrate.

BACKGROUND

The statements in this section merely provide background information related to the present disclosure and may not constitute prior art.

Machines such as motor vehicles, lawn mowers, motor boats, etc., require electrical/electronic components such as sensors, controllers, processors, light emitting devices, etc., to be electrically connecting to each other and to a power source. However, due to space constraints within or on such machines, the use of traditional electrical wire to electrically connect such devices may not be practical and the use of newer technologies such as flat wire or painted circuits may be cost prohibitive.

The present disclosure addresses the issues of electrically connecting electrical/electronic components among other issues related to forming electrically conductive traces on a substrate.

SUMMARY

In one form of the present disclosure, a system for applying conductive tape to a substrate includes a segment feeder arm configured to feed segments of conductive tape to the substrate and a segment placement armature configured to grasp and position segments of the conductive tape in a predetermined pattern on the substrate. In some aspects of the present disclosure, the segments of conductive tape comprise a plurality of conductive tape bend segments and at least one conductive tape branch segment. In such aspects, the segment placement armature is configured to position the plurality of conductive tape bend segments on the substrate to form a conductive tape bend. Also, the segment placement armature is configured to position the plurality of conductive tape bend segments overlapping each other to form the conductive tape bend and position the at least one conductive tape branch segment in contact with and extending from the conductive tape bend. In some aspects of the present disclosure, the segment placement armature includes a segment grasping arm configured to grasp the segments of the conductive tape from the segment feeder arm and position the grasped segments of the conductive tape onto the substrate. In such aspects, the segment grasping arm is configured to apply a force onto the segments of the conductive tape positioned on the substrate. Also, a roller configured to roll over and apply another force onto the segments of the conductive tape positioned on the substrate can be included.

In some aspects of the present disclosure, the segment placement armature is configured to position a first segment of the conductive tape on the substrate at a first location and a second segment of the conductive tape at a second location oriented at a non-zero angle relative to the first location. In such aspects, the second segment can overlap the first segment and the first segment and the second segment can be both conductive tape bend segments positioned to form the conductive tape bend.

In some aspects of the present disclosure, a laser configured to laser weld the segments together can be included as can a coating applicator configured to apply a coating over the segments on the substrate. In the alternative, or in addition to, the segment feed arm and the segment placement armature are configured to apply a tape over a conductive tape trace previously applied to the substrate.

In some aspects of the present disclosure, the segment feed arm can include at least one small radius corner such that the segments of the conductive tape separate from a backing strip of the conductive tape when the segments reach the small radius corner.

In another form of the present disclosure, a system for applying conductive tape trace to a substrate includes a segment feeder arm configured to feed segments of conductive tape to the substrate and a length of conductive tape with a backing strip and a plurality of conductive tape bend segments attached to the backing strip. The segment feeder arm includes at least one small radius corner such that each of the plurality of conductive tape bend segments separate from the backing strip when a given conductive tape bend segment reaches the small radius corner. Also, a segment placement armature is configured to grasp and position the plurality of conductive tape bend segments on the substrate at different positions relative to each other and form a conductive trace bend on the substrate. In some aspects of the present disclosure, the system includes a roller configured to roll over and apply force onto the plurality of conductive tape bend segments positioned on the substrate. Also, another length of conductive tape with a conductive tape branch segment is included and the segment feeder arm and the segment placement armature are configured to position the conductive tape branch segment in contact with and to extend from the conductive trace bend formed by the plurality of conductive tape bend segments.

In still another form of the present disclosure, a method of forming a conductive trace on a substrate includes positioning a plurality of conductive tape segments on the substrate using a system with a segment feeder arm, a length of conductive tape, and a segment placement armature. The segment feeder arm is configured to feed segments of conductive tape to the substrate and the length of conductive tape has a backing strip with a plurality of conductive tape bend segments. In some aspects of the present disclosure, another length of conductive tape with a another backing strip and a conductive tape branch segment included. In such aspects, the segment feeder arm includes at least one small radius corner such that each of the plurality of conductive tape bend segments separate from the backing strip when a given conductive tape bend segment reaches the small radius corner. Also, the conductive tape branch segment separates from the another backing strip when the conductive tape branch segment reaches the small radius corner. A segment placement armature is included and is configured to grasp and position the plurality of conductive tape bend segments and the conductive tape branch segment on the substrate at different positions relative to each other and form a conductive trace on the substrate. The method also includes applying force on the segments of the conductive tape positioned on the substrate to secure the position of the segments of the conductive tape on the substrate. In some aspects of the present disclosure, the method includes laser welding the segments of conductive tape together and/or applying a coating over the conductive trace formed on the substrate.

Further areas of applicability will become apparent from the description provided herein. It should be understood that the description and specific examples are intended for purposes of illustration only and are not intended to limit the scope of the present disclosure.

DRAWINGS

Figure 2:
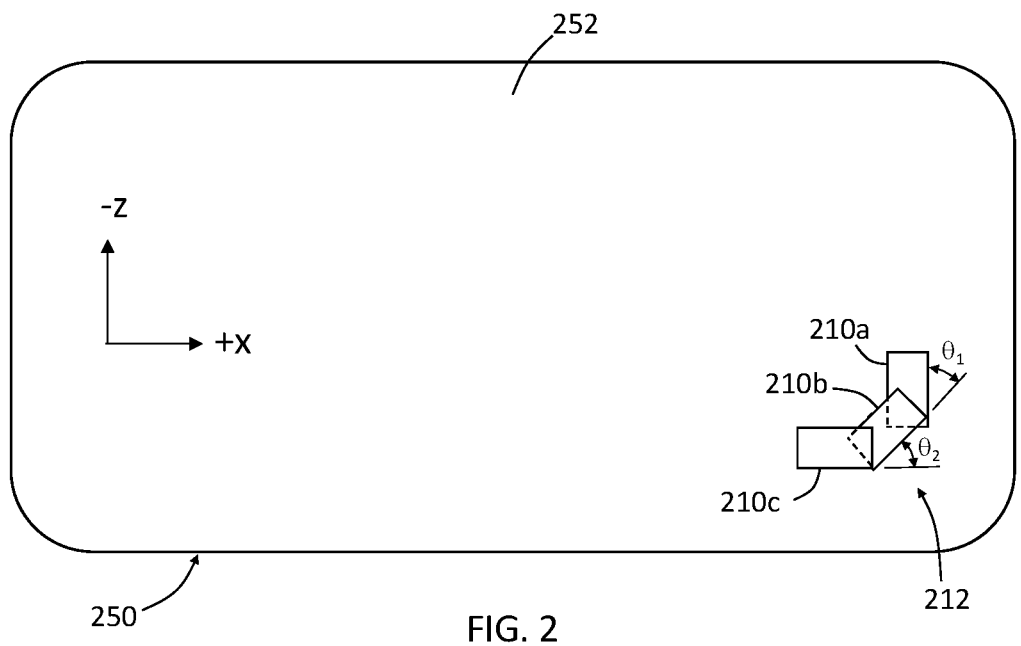
Figure 3:
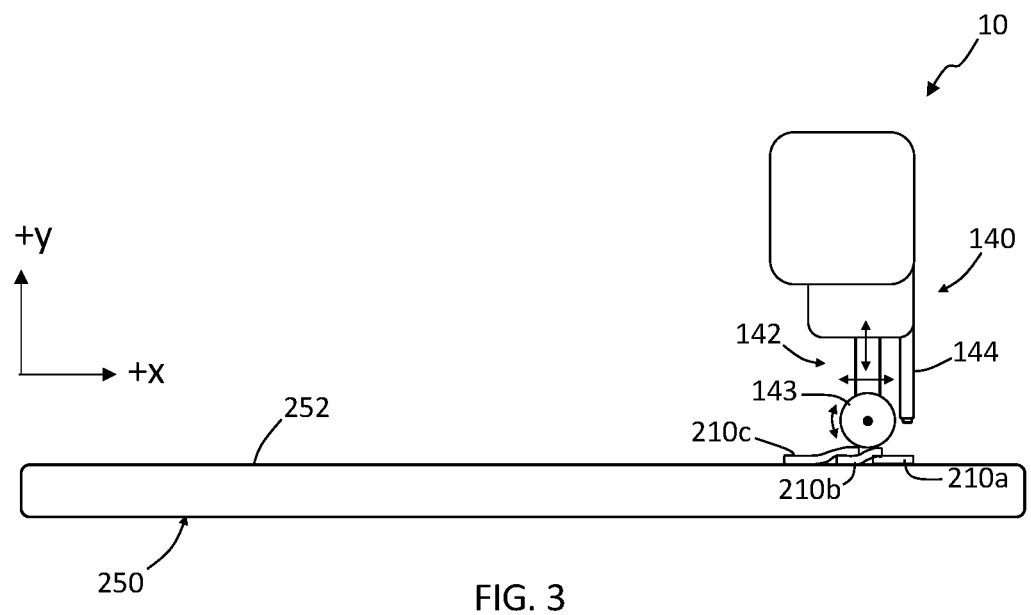
Figure 4A:
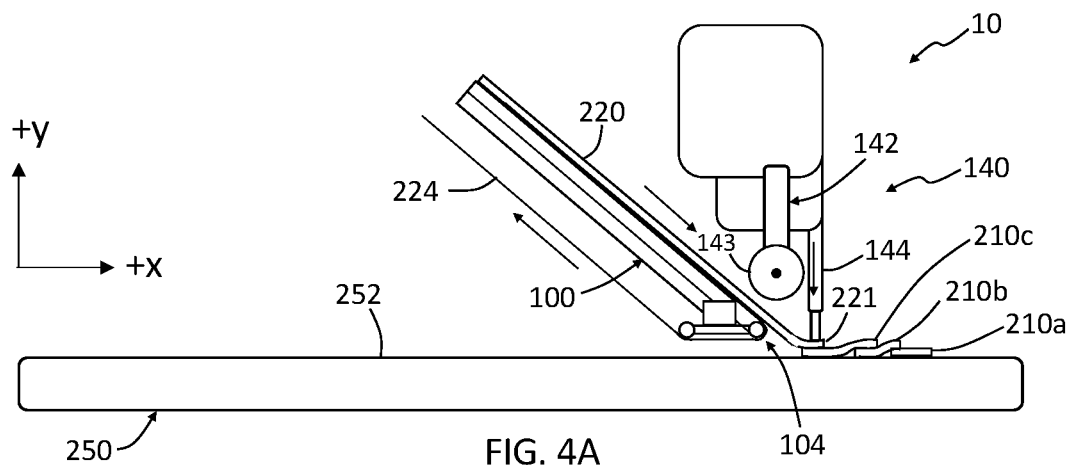
Figure 4B:
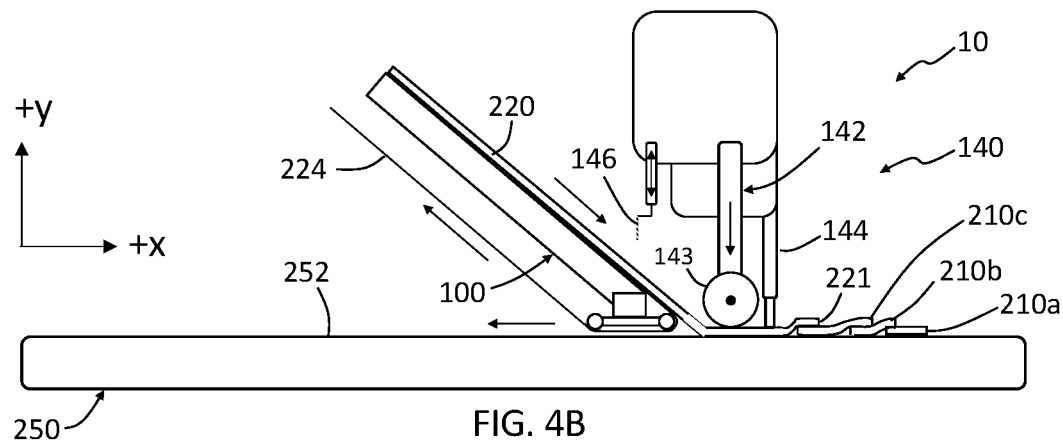
Figure 4C:
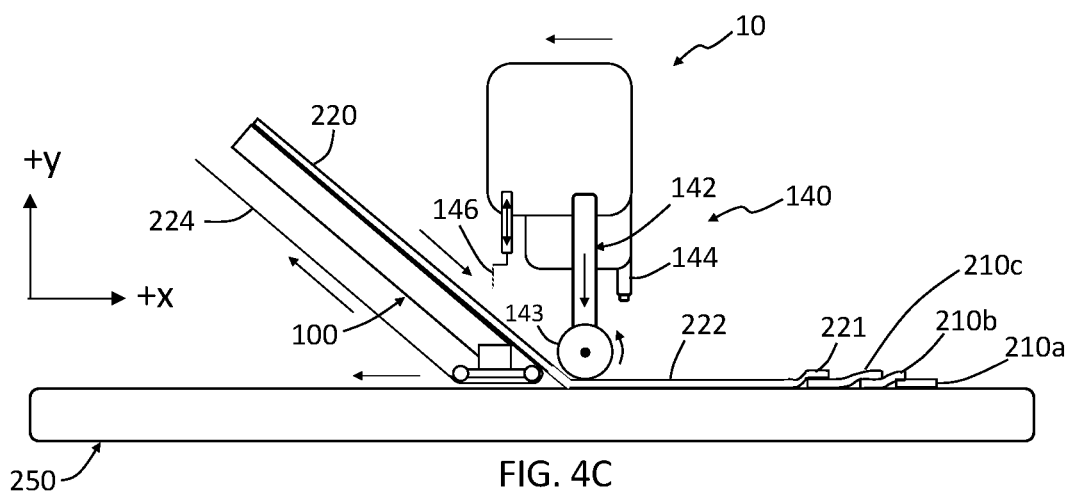
Figure 5:
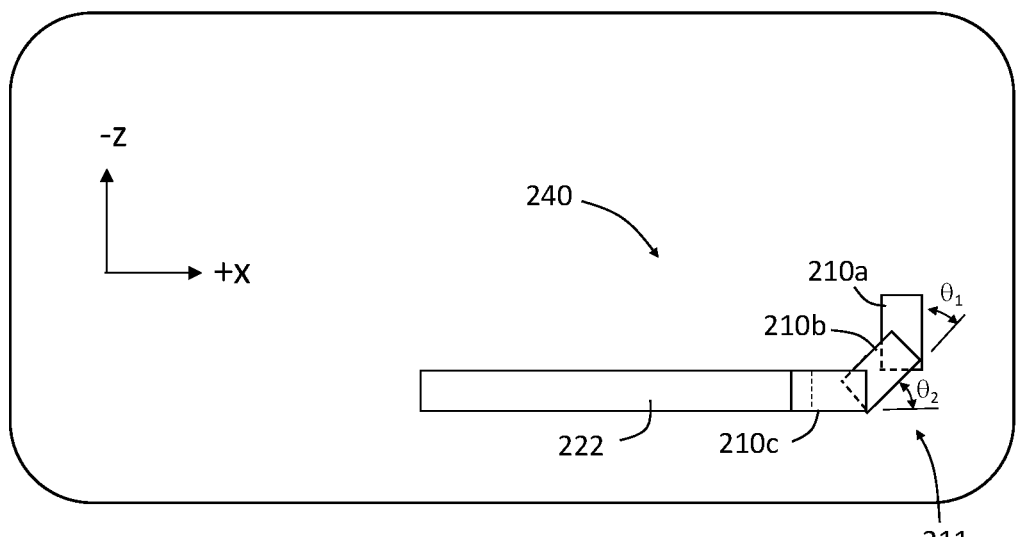
Figure 6:
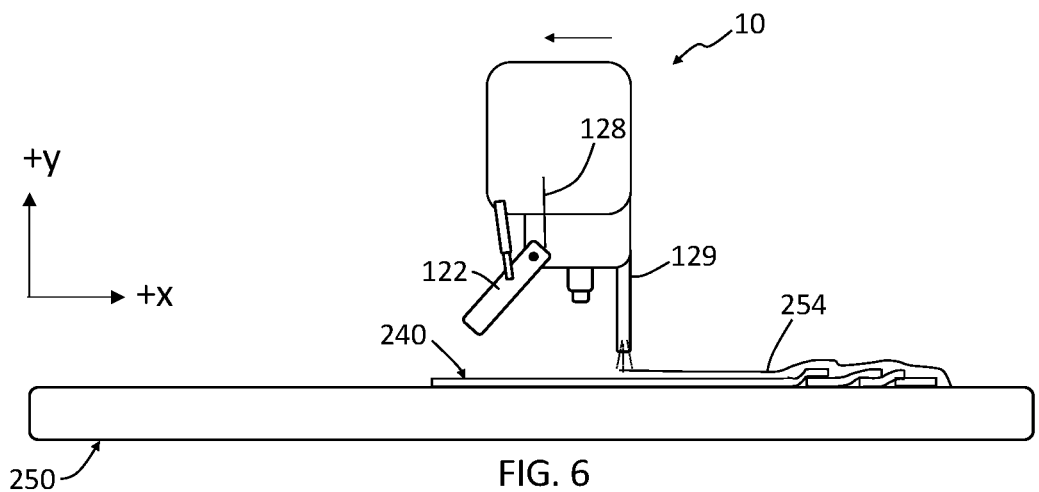
Figure 7:
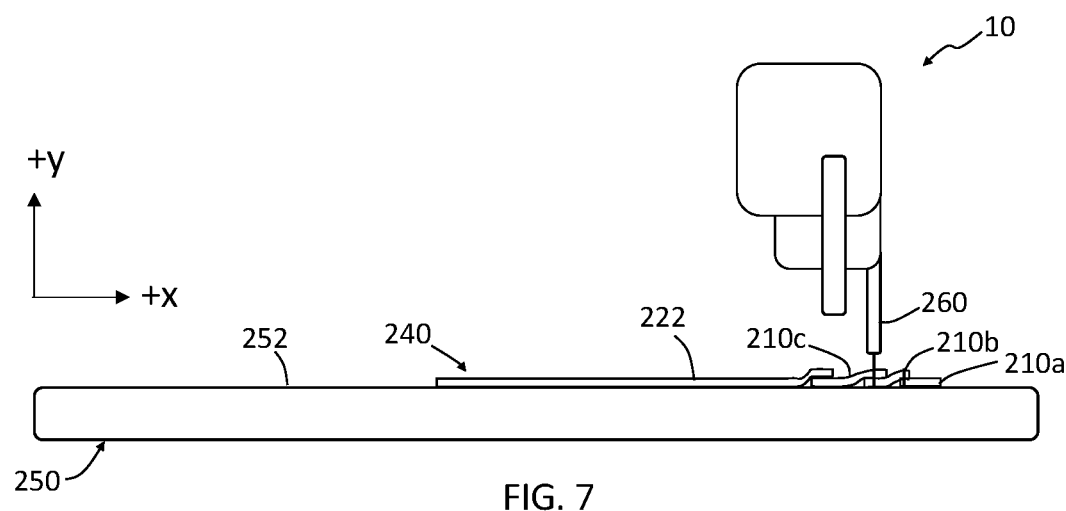
Figure 8:
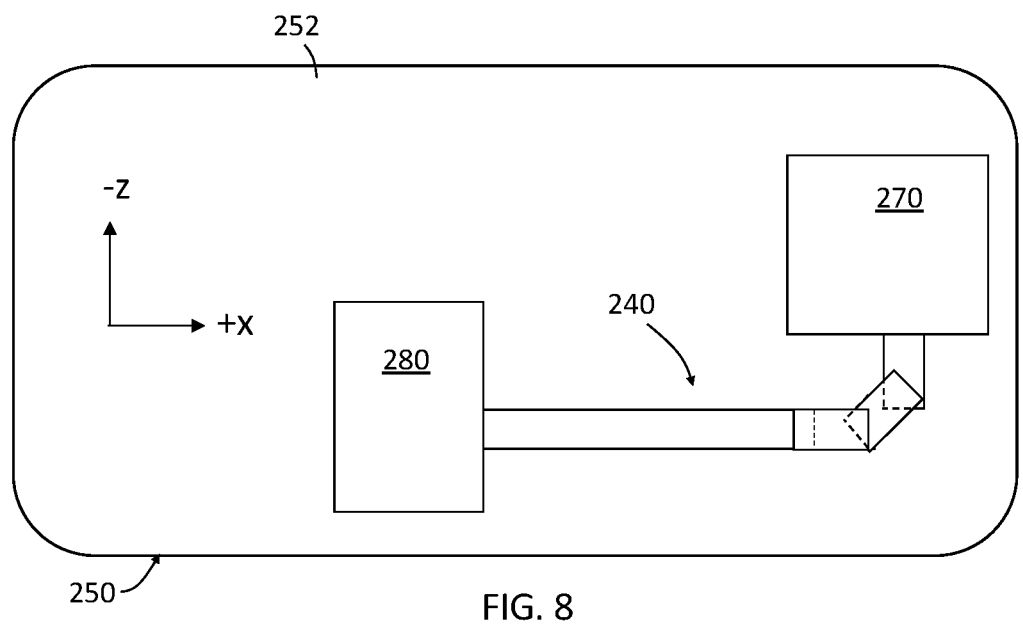
Figure 9A:
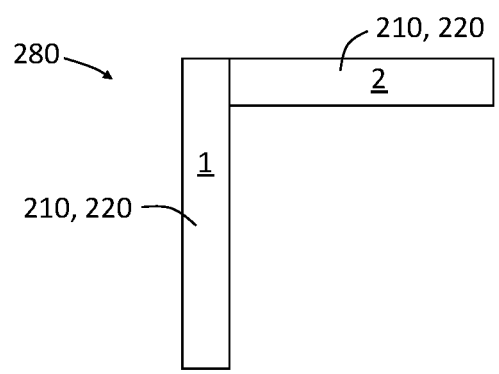
Figure 9B:
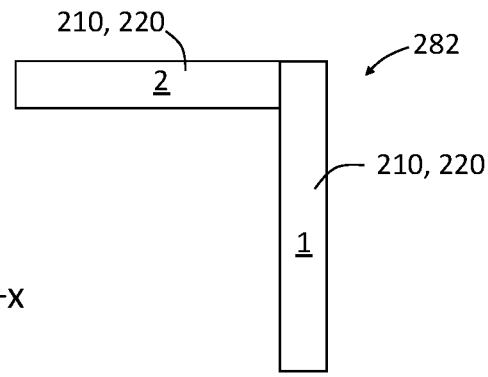
Figure 10A:
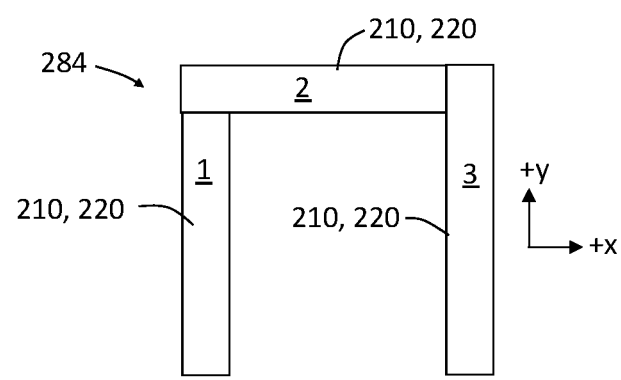
Figure 10B:
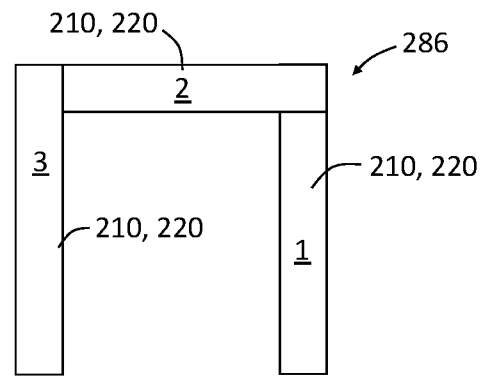
Figure 11A:
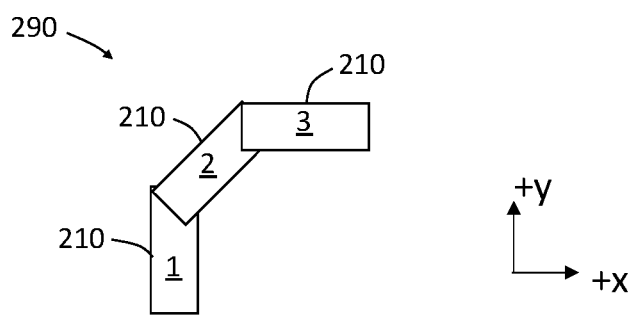
Figure 11B:
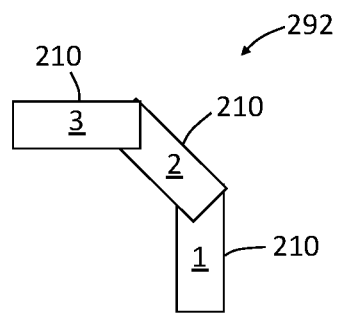
Figures 12A, 12B:
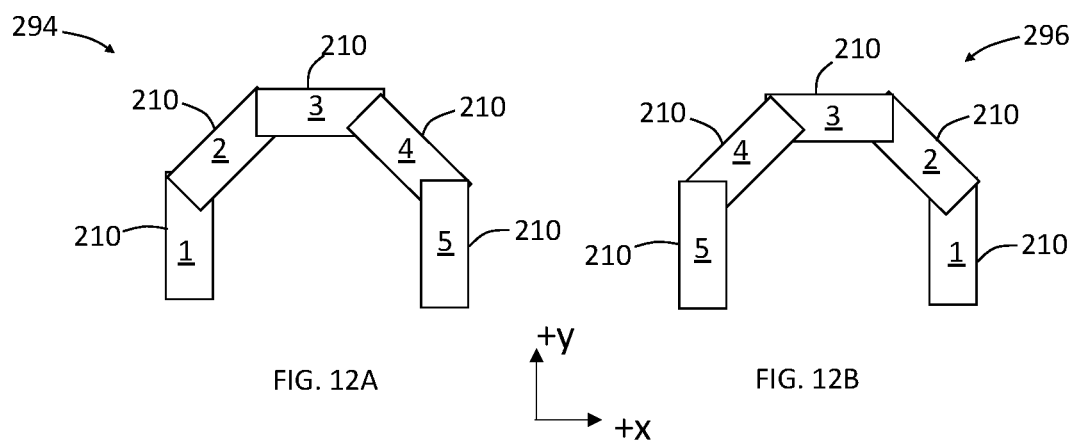

In order that the disclosure may be well understood, there will now be described various forms thereof, given by way of example, reference being made to the accompanying drawings, in which:

FIG. 1 schematically depicts a side view of a system forming an electrically conductive trace on a substrate using electrically conductive tape according to the teachings of the present disclosure;

FIG. 2 schematically depicts a top view of the substrate in FIG. 1 with an electrically conductive trace bend according to the teachings of the present disclosure;

FIG. 3 schematically depicts a side view of the system in FIG. 1 applying a rolling force on the electrically conductive trace bend in FIG. 2 according to the teachings of the present disclosure;

FIGS. 4A-4C schematically depict the system in FIG. 1 performing a series of steps to form an electrically conductive trace branch on the substrate according to the teachings of the present disclosure;

FIG. 5 schematically depicts a top view of the substrate in FIG. 4C with an electrically conductive trace formed from the electrically conductive trace branch in electrical contact with and extending from the electrically conductive trace bend (FIG. 2) according to the teachings of the present disclosure;

FIG. 6 schematically depicts a side view of the system in FIG. 1 applying a coating on the electrically conductive trace in FIG. 5 according to the teachings of the present disclosure;

FIG. 7 schematically depicts a side view of the system in FIG. 1 joining the electrically conductive tape segments in FIG. 5 according to the teachings of the present disclosure;

FIG. 8 schematically depicts a top view of the substrate in FIG. 5 with two electronic components electrically connected by the electrically conductive trace;

FIGS. 9A and 9B schematically depict a right and a left 90 degree electrically conductive trace bend, respectively, formed according to the teachings of the present disclosure;

FIGS. 10A and 10B schematically depict a pair of electrically conductive trace U-bends formed according to the teachings of the present disclosure;

FIGS. 11A and 11B schematically depict a right and a left 90 degree electrically conductive trace bend, respectively, formed according to the teachings of the present disclosure; and FIGS. 12A and 12B schematically depict a pair of electrically conductive trace U-bends formed according to the teachings of the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

Referring now to FIG. 1, a system 10 for applying electrically conductive tape (referred to herein simply as "conductive tape") and electrically conductive tape traces (referred to herein simply as "conductive tape traces") includes a conductive tape applicator 20 comprising a segment feeder arm 100 and a segment placement armature 120. In some aspects of the present disclosure, the conductive tape applicator 20 includes a coating applicator 129 and a welder 260 as described in greater detail below.

The conductive tape applicator 20 has at least two degrees of movement freedom. For example, and as schematically depicted in FIG. 1, the conductive tape applicator 20 can move up-and-down (y-direction), side-to-side (x-direction) and rotate about a vertical (y-axis) axis 2. The segment feeder arm 100 is configured to move (feed, deliver, etc.) a plurality of conductive tape segments 210 to a substrate 250 and the segment placement armature 120 is configured to grasp and move the plurality of conductive tape segments 210 from the segment feeder arm 100 to a surface 252 of the substrate 250.

In some aspects of the present disclosure, the conductive tape applicator 20 includes a supply of conductive tape 200 with a backing strip 214 (e.g., a roll of conductive tape 200) and the plurality of conductive tape segments 210 attached to the backing strip 214. A conductive tape movement mechanism 205 pulls on the back strip 214 such that the plurality of conductive tape segments 210 move from the supply of conductive tape 200 towards the surface 252 of the substrate 250. In some aspects of the present disclosure, the segment feeder arm 100 includes at least one a small radius corner 104 such that a conductive tape segment 210 separates from the backing strip 214 when the conductive tape segment 210 (and the back strip to which it is attached) reaches the small radius corner 104 as schematically depicted in FIG. 1. That is, the conductive tape segment 210 has a stiffness that resists bending around the small radius corner 104. Accordingly, as a conductive tape segment 210 moves from the supply of conductive tape 200 to and reaches the small radius corner 104, the conductive tape segment 210 separates from the backing strip as the backing strip 104 moves around the small radius corner 104 and travels to the conductive tape movement mechanism 205. As used herein, the phrase "small radius corner" refers to a corner of with a radius, and as a result of the stiffness of a conductive tape segment, results in the conductive tape segment separating from a backing strip as the backing strip travels around the corner. Non-limiting examples of a radius of the small radius corner 104 include a radius between 1 millimeter (mm) and 2 mm, 2 mm and 4 mm, 4 mm and 6 mm, 6 mm and 8 mm, 8 mm and 10 mm, 10 mm and 15 mm, 15 mm and 20 mm, and 20 mm and 25 mm.

The segment placement armature 120 includes a segment grasping arm 122. The segment grasping arm 122 includes a pivot axis 124, an actuator 126 and a vacuum line 128 in communication with a grasping end 123 of the segment grasping arm 122. The segment grasping arm 122 pivots about the pivot axis 124 such that the distal end 123 is in position to grasp (via suction/vacuum) a conductive tape segment 210 as it separates from the backing strip 214 at the small radius corner 104. After grasping the conductive tape segment 210, the segment grasping arm 122 pivots about the pivot axis 124 (counter clockwise in FIG. 1) and positions the conductive tape segment 210 on the surface 252 of the substrate 250. In some aspects of the present disclosure, the segment grasping arm 122 moves up-and-down parallel to the pivot axis 2 to position or place the conductive tape segment 210 on the surface 252 and apply a placement force thereon (e.g., a first force) such that the conductive tape segment 210 is attached to the surface 252. Accordingly, in some aspects of the present disclosure, the segment grasping arm 122 performs three (3) functions: (1) grasps/picks the conductive tape segment 210; (2) positions the conductive tape segment 210; and (3) places the conductive tape segment 210 on the surface 252 and applies a placement force thereon.

The conductive tape segment 210, and other conductive tape segments disclosed herein, can have a conductive or non-conductive adhesive that assists in attaching the conductive tape segment 210 to the surface 252 of the substrate 250. For example, a conductive adhesive 211 can be positioned between the conductive tape segment 210 and the surface 252, between two conductive tape segments 210 overlapping each other, and the like. After the conductive tape segment 210 is positioned on the surface 252, the segment grasping arm 122 can apply another force (e.g., a second force greater than the first force) on the conductive tape segment 210. That is, the segment grasping arm 122 moves up-and-down (y-direction) such that the another force is applied to the surface 252 of the substrate 250 and to a conductive tape segment(s) 210 positioned on the surface 252.

In some aspects of the present disclosure, a conductive tape segment 210 (e.g., a second conductive tape segment 210b) from the supply of conductive tape 200 can be positioned on the surface 252 in contact with a conductive tape segment 210 already positioned and attached to the surface 252 (e.g., a first conductive tape segment 210a). In such aspects, the second conductive tape segment 210b can be positioned to at least partially overlap the first conductive tape segment 210a as schematically depicted in FIG. 1. For example, after the first conductive tape segment 210a is positioned on the surface 252 by the segment grasping arm 122 as described above, the segment grasping arm 122 pivots about the pivot axis 124 towards the segment feeder arm 100 (clockwise in FIG. 1) and grasps another conductive tape segment 210 as it separates from the backing strip 214 at the small radius corner 104. After grasping another conductive tape segment 210, the segment grasping arm 122 pivots about the pivot axis 124 towards the surface 252 (counter clockwise in FIG. 1) and positions the another conductive tape segment 210 (e.g., second conductive tape segment 210b) partially over (y-direction) the first conductive tape segment 210a and applies a force thereon as schematically depicted in FIG. 1. It should be understood that the conductive tape applicator 20, segment placement armature 120, and/or segment grasping arm 122 can move, rotate, etc., such that the second conductive tape segment 210b is positioned on the surface 252 at a non-zero angle relative to the first conductive tape segment 210a such that a bend of conductive tape (i.e., conductive tape segments) is provided. As used herein, the term "bend" refers to a portion of a conductive trace that is not linear.

Referring now to FIG. 2, a bend 212 formed on the surface 252 from a plurality of conductive tape segments 210 as described above is shown. Particularly, the first conductive tape segment 210a is positioned and attached to the surface 252 generally parallel to the z-axis in the figure. The second conductive tape segment 210b is positioned and overlaps the first conductive tape segment 210a and is aligned at a non-zero angle $\theta_1$ relative to the first conductive tape segment 210a. Also, a third conductive tape segment 210c aligned at a non-zero angle $\theta_2$ relative to the second conductive tape segment 210b is positioned and overlaps the second conductive tape segment 210b such that a 90° bend of conductive tape is provided. It should be understood that the segment grasping arm 122 grasps the first conductive tape segment 210a from the segment feeder arm 100 as the first conductive tape segment 210a separates from the back strip 214 at the small radius corner 104 and then positions the first conductive tape segment 210a on the surface 252 as schematically depicted in FIG. 2. Then the segment grasping arm 122 grasps the second conductive tape segment 210b from the segment feeder arm 100 as the second conductive tape segment 210b separates from the backing strip 214 at the small radius corner 104 and then positions the second conductive tape segment 210b on the surface 252 overlapping the first conductive tape segment 210a as schematically depicted in FIG. 2. Also, the segment grasping arm 122 grasps the third conductive tape segment 210c from the segment feeder arm 100 as the third conductive tape segment 210c separates from the backing strip 214 at the small radius corner 104 and then positions the third conductive tape segment 210c on the surface 252 overlapping the second conductive tape segment 210b as schematically depicted in FIG. 2. It should also be understood that the conductive tape applicator 20 can rotate about the vertical axis 2 before, after or during the segment grasping arm 122 grasping a conductive tape segment 210 such that the conductive tape segments 210a, 210b, 210c are positioned on the surface 252 at non-zero angles relative to each other.

The segment grasping arm 122 can apply a force to the first, second and/or third conductive tape segments 210a, 210b, 210c during placement on the surface 252 as described above. In the alternative, or in addition to, additional steps of applying a force to the bend of conductive tape 211 can be included. For example, the conductive tape applicator 20 may include a roller 143 that can be used to apply a force (e.g., a rolling force) to the bend of conductive tape 211 as schematically depicted in FIG. 3. The roller 143 may be part of a roller armature 140 with a roller arm 142, or in the alternative, may be part of the segment placement armature 120. That is, the conductive applicator 20 may rotate about the axis 2 such that more than one armature can be positioned over a conductive tape segment and apply a process step thereto.

While FIGS. 1-3 schematically depict the system 10 forming a bend 212 of conductive tape, in some aspects of the present disclosure the system 10 forms a continuous length (referred to herein as a "branch") of conductive tape as schematically depicted in FIGS. 4A-5. Particularly, the conductive tape supply 200 (not shown in FIGS. 4A-5) can include a branch of conductive tape 220 that is fed towards the surface 252 and an end 221 of the conductive tape branch 220 is grasped and positioned in contact with a conductive tape segment 210 (e.g., the third conductive tape segment 210c shown in FIG. 3). In some aspects of the present disclosure, the end 221 of the conductive tape branch 220 is grasped, positioned and placed on the surface 252 with a branch grasping arm 144 similar to the grasping, positioning and placing of a conductive tape segment 210 using the segment grasping arm 122 described above. In such aspects, the system 10 can be a dual capability system with one capability for grasping, positioning and placing conductive tape segments and another capability for grasping, positioning and placing conductive tape branches.

After the end 221 is attached to the third conductive tape segment 210c, the roller 143 moves downwardly (−y direction) such that a portion of the conductive tape branch 220 extending between the end 221 and the tape feeder arm 100 is pressed onto the surface 252 as schematically depicted in FIG. 4B. The branch grasping arm 144 can then be raised (+y direction) and the roller 143 can roll across and press the conductive tape branch 220 onto the surface 252 as it extends beyond the tape feeder arm 100 as shown in FIG. 4C.

The conductive tape branch 220 provided from the conductive tape supply 200 can have a total length for a specific conductive trace branch, or in the alternative, the system 10 can include a tape cutter 146 that cuts the conductive tape branch 220 once a desired length has been separated from the backing strip 224 and/or removed from the conductive tape supply 200. Accordingly, the system 10 provides a conductive tape trace 240 comprising at least one conductive tape bend 212 and/or at least one conductive tape branch 221 as shown in FIG. 5.

In some aspects of the present disclosure, and as noted above, the conductive applicator 20 includes a coating applicator 129 that applies a coating, film or tape 254 over the conductive tape trace 240 as shown in FIG. 6. In some aspects of the present disclosure, the coating, film or tape 254 is electrically insulating. In the alternative, or in addition to, the conductive applicator 20 can include a welder 260 (e.g., a laser welder) to weld/join the plurality of conductive tape segments 210 and the conductive tape branch 220 to each other as shown in FIG. 7. It should be understood that the coating, film or tape 254 can be applied to the conductive tape trace 240 after the plurality of conductive tape segments 210 and conductive tape branch 220 have been welded/joined to each other. It should also be understood that the conductive tape trace 240 can be used to provide electrical communication between electronic components 270, 280 as shown in FIG. 8. Non-limiting examples of electronic components 270, 280 include sensors, switches, actuators, controllers and the like.

Referring now to FIGS. 9A-12B, a number of non-limiting examples of conductive tape bends are schematically depicted. For example, FIGS. 9A and 9B schematically depict a 90° right bend and a 90° left bend, respectively, formed from two conductive tapes segments 210 and/or 220 and FIGS. 10A and 10B schematically depict a pair of 180° (U-shaped) bends formed from three conductive tape segments 210 and/or 220. The numbers 1, 2, 3, . . . in FIGS. 9A-12B correspond to the order in which a particular conducive tape segment is positioned and attached to a substrate (not shown). FIGS. 11A and 11B schematically depict a 90° right bend and a 90° left bend, respectively, formed from three conductive tapes segments 210 and FIGS. 12A and 12B schematically depict a pair of 180° (U-shaped) bends formed from five conductive tape segments 210.

The conductive tape segments 210 and conductive tape branch 220 can be formed from any known conductive material used to form conductive traces. Non-limiting examples of conductive materials include copper, copper alloys, aluminum, aluminum alloys, silver, silver alloys, and the like. The conductive tape segments 210 and conductive tape branch 220 can have a thickness (y-direction) and a width (e.g., z-direction for conductive tape branch 220 shown in FIG. 5) suitable for a given and desired electrical current to flow through a given conductive tape trace 240. Not limiting ranges for the thickness include 10 micrometers (microns or μm) to 50 μm thick, 50 μm to 100 μm thick, 100 μm to 150 μm thick, 150 μm to 200 μm thick, 200 μm to 300 μm thick, 300 μm to 500 μm thick, 500 μm to 750 μm thick, 750 μm to 1000 μm thick, 1000 μm to 2000 μm thick, 2000 μm to 3000 μm, 3000 μm to 4000 μm, and the like. Non-limiting ranges for the width include 0.5 millimeters (mm) to 1.0 mm, 1.0 mm to 1.5 mm, 1.5 mm to 2.0 mm, 2.0 mm to 2.5 mm, 2.5 mm to 3.0 mm, 3.0 mm to 4.0 mm, 4.0 mm to 5.0 mm, and the like. The conductive adhesive 211 can be any known conductive adhesive used to join or attached a conductive tape segment and/or a conductive component to another conductive tape segment and/or a conductive component. Non-limiting examples of conductive adhesives include adhesives with a conductive component such as silver, copper, graphite, etc., and an adhesive component such as a varnish, a resin or silicone.

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice, manufacturing technology, and testing capability.

As used herein, the phrase at least one of A, B, and C should be construed to mean a logical (A OR B OR C), using a non-exclusive logical OR, and should not be construed to mean "at least one of A, at least one of B, and at least one of C."

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A system for applying conductive tape to a substrate comprising:
    a segment feeder arm configured to feed segments of conductive tape to the substrate;
    a length of conductive tape comprising a plurality of conductive tape segments;
    a segment placement armature with a segment grasping arm configured to grasp the plurality of conductive tape segments of the length of conductive tape, pivot about a pivot axis, and position the plurality of conductive tape segments of the length of conductive tape on the substrate; and
    a roller configured to roll over and apply force onto the plurality of conductive tape segments of the length of conductive tape positioned on the substrate,
    wherein the segment feeder arm feeds the segments of conductive tape towards the substrate and the segment placement armature applies each segment of conductive tape in a predetermined pattern on the substrate and the roller rolls over and applies force onto the plurality of conductive tape segments positioned on the substrate.

2. The system of claim 1, wherein the segments of conductive tape comprise a plurality of conductive tape bend segments and at least one conductive tape branch segment.

3. The system of claim 2, wherein the segment placement armature is configured to position the plurality of conductive tape bend segments on the substrate to form a conductive tape bend.

4. The system of claim 3, wherein the segment placement armature is configured to position the plurality of conductive tape bend segments overlapping each other to form the conductive tape bend.

5. The system of claim 3, wherein the segment placement armature is configured to position the at least one conductive tape branch segment in contact with and extending from the conductive tape bend.

6. The system of claim 1, wherein the segment grasping arm is configured to apply a force onto the segments of the conductive tape positioned on the substrate.

7. The system of claim 1, wherein the segment placement armature is configured to position a first segment of the conductive tape on the substrate at a first location and a second segment of the conductive tape at a second location oriented at a non-zero angle relative to the first location.

8. The system of claim 7, wherein the second segment overlaps the first segment.

9. The system of claim 8, wherein the first segment and the second segment are both conductive tape bend segments positioned to form a conductive tape bend on the substrate.

10. The system of claim 1 further comprising a laser configured to laser weld the segments of conductive tape together.

11. The system of claim 1 further comprising a coating applicator configured to apply a coating over the segments of conductive tape on the substrate.

12. The system of claim 1, wherein the segment feeder arm has at least one small radius corner such that the segments of the conductive tape separate from a backing strip of the conductive tape when the segments reach the small radius corner.

13. The system of claim 1 further comprising insulating tape, wherein the segment feeder arm and the segment placement armature are configured to apply the insulating tape over a conductive tape trace previously applied to the substrate.

14. A system for applying conductive tape trace to a substrate comprising:
- a segment feeder arm configured to feed segments of conductive tape to the substrate;
- a length of conductive tape comprising a backing strip with a plurality of conductive tape bend segments, wherein the segment feeder arm comprises at least one small radius corner such that each of the plurality of conductive tape bend segments separate from the backing strip when a given conductive tape bend segment reaches the small radius corner;
- a segment placement armature configured to grasp the plurality of conductive tape bend segments as each segment separates from the backing strip and position the plurality of conductive tape bend segments on the substrate at different positions relative to each other and form a conductive trace bend on the substrate; and
- a roller configured to roll over and apply force onto the plurality of conductive tape bend segments positioned on the substrate.

15. The system of claim 14 further comprising another length of conductive tape with a conductive tape branch segment, wherein the segment feeder arm and the segment placement armature are configured to position the conductive tape branch segment in contact with and extending from the conductive trace bend formed by the plurality of conductive tape bend segments.

* * * * *